(12) United States Patent
Arguin et al.

(10) Patent No.: US 10,784,202 B2
(45) Date of Patent: Sep. 22, 2020

(54) HIGH-DENSITY CHIP-TO-CHIP INTERCONNECTION WITH SILICON BRIDGE

(71) Applicant: International Business Machines Corporation, Armonk, NY (US)

(72) Inventors: Francois Arguin, Bromont (CA); Luc Guerin, Granby (CA); Maryse Cournoyer, Granby (CA); Steve E. Whitehead, Quebec (CA); Jean Audet, Granby (CA); Richard D. Langlois, Granby (CA); Christian Bergeron, Granby (CA); Pascale Gagnon, Brigham (CA); Nathalie Meunier, St-Paul-d'Abbotsford (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/828,463

(22) Filed: Dec. 1, 2017

(65) Prior Publication Data
US 2019/0172787 A1   Jun. 6, 2019

(51) Int. Cl.
*H01L 23/538* (2006.01)
*H01L 25/18* (2006.01)
(Continued)

(52) U.S. Cl.
CPC .... *H01L 23/5381* (2013.01); *H01L 23/49827* (2013.01); *H01L 23/49833* (2013.01);
(Continued)

(58) Field of Classification Search
CPC ............ H01L 23/5381; H01L 23/5384; H01L 23/5385; H01L 23/49827; H01L 23/49894;
(Continued)

(56) References Cited

U.S. PATENT DOCUMENTS 8,227,904 B2   7/2012   Braunisch et al.
9,368,450 B1*  6/2016   Gu ...................... H01L 23/5385
(Continued)

OTHER PUBLICATIONS

Kopp et al, "Quilt Packaging: A robust coplanar chip-to-chip interconnect offering very high bandwidth", CS Mantech Conference, May 17-20, 2010, Portland, Oregon, USA, 4 pages.
(Continued)

*Primary Examiner* — Dao H Nguyen
(74) *Attorney, Agent, or Firm* — Monchai Chuaychoo

(57) ABSTRACT

A package and system for high-density chip-to-chip interconnection is provided. Embodiments of the present invention utilizes a plurality of circuit dies including a laminate substrate adjacent to the plurality of circuit dies. It also includes a conductive spacer disposed between the laminate substrate and one of the plurality of circuit dies, a silicon bridge and a conductive interposer disposed between the laminate substrate and the plurality of dies and adjacent to the conductive spacer. Furthermore the embodiment of this present invention can include a top layer of a printed circuit board (PCB) coupled with a bottom layer of the laminate substrate. The conductive spacer comprises, at least of, a laminate, organic or copper material.

15 Claims, 4 Drawing Sheets

(51) Int. Cl.
*H01L 23/498* (2006.01)
*H01L 25/065* (2006.01)
*H01L 23/00* (2006.01)

(52) U.S. Cl.
CPC .. *H01L 23/49883* (2013.01); *H01L 23/49894* (2013.01); *H01L 23/5384* (2013.01); *H01L 24/17* (2013.01); *H01L 25/0652* (2013.01); *H01L 25/0655* (2013.01); *H01L 25/18* (2013.01); *H01L 24/13* (2013.01); *H01L 24/16* (2013.01); *H01L 2224/13147* (2013.01); *H01L 2224/16113* (2013.01); *H01L 2224/16145* (2013.01); *H01L 2224/16227* (2013.01); *H01L 2224/16235* (2013.01); *H01L 2224/16238* (2013.01); *H01L 2224/1703* (2013.01); *H01L 2224/17181* (2013.01); *H01L 2224/17517* (2013.01); *H01L 2225/06513* (2013.01); *H01L 2225/06517* (2013.01); *H01L 2225/06548* (2013.01); *H01L 2924/1431* (2013.01); *H01L 2924/1434* (2013.01); *H01L 2924/15192* (2013.01); *H01L 2924/15311* (2013.01)

(58) Field of Classification Search
CPC ......... H01L 23/49883; H01L 23/49833; H01L 25/0655; H01L 25/0652; H01L 25/18; H01L 24/17; H01L 24/13; H01L 24/16
USPC ....... 257/741, 666, 692, 758, 774, 777, 778, 257/782, 783, 776, E23.023, E23.069, 257/E23.169, E21.499, E21.506, E21.508, 257/E29.002; 438/107, 108, 66, 667
See application file for complete search history.

(56) References Cited

U.S. PATENT DOCUMENTS

| | | | |
|---|---|---|---|
| 9,443,824 B1* | 9/2016 | We | H01L 25/0652 |
| 9,548,264 B2 | 1/2017 | Roy et al. | |
| 9,595,494 B2* | 3/2017 | We | H01L 25/0652 |
| 2009/0089466 A1* | 4/2009 | Cunningham | H01L 23/48 710/100 |
| 2012/0061856 A1 | 3/2012 | Vora | |
| 2014/0321091 A1 | 10/2014 | Zhang et al. | |
| 2015/0001733 A1* | 1/2015 | Karhade | H01L 23/538 257/774 |
| 2016/0013153 A1 | 1/2016 | Meyer | |
| 2018/0157782 A1* | 6/2018 | Rossi | G06F 17/5077 |

OTHER PUBLICATIONS

Mahajan et al., "Embedded Multi-Die Interconnect Bridge (EMIB)—A High Density, High Bandwidth Packaging Interconnect", 2016 IEEE 66th Electronic Components and Technology Conference, © 2016 IEEE, DOI 10.1109/ECTC.2016.201, 9 pages.

* cited by examiner

HIGH-DENSITY CHIP-TO-CHIP INTERCONNECTION WITH SILICON BRIDGE

BACKGROUND OF THE INVENTION

The present invention relates generally to the field of packaging of integrated circuits (ICs) and more particularly to IC package interconnection of integrated circuits.

As integrated circuits approach the limit of Moore's law, the design has been to integrate multiple die with in the central process unit (CPU) and other components. The increase in transistor density requires high-density die-to-die connections. In addition, these components are often connected to a subassembly such as a substrate or motherboard. The ICs can be packaged and inserted into an IC package that is mounted on the subassembly. One of the many influences of the design for the overall size is the spacing required for the interconnection of the contacts of the IC packages. As the spacing is reduced and dies requires high-density wiring, the packaged ICs can become less robust and the cost of meeting the spacing requirements can increase.

Hence, there exist a need to address the spacing challenges for contacts and wiring of ICs.

SUMMARY

According to an embodiment, a package structure for high-density chip-to-chip interconnection, the package structure comprising: a plurality of circuit dies; a laminate substrate adjacent to the plurality of circuit dies; a spacer disposed between the laminate substrate and one of the plurality of circuit dies; and a conductive interposer disposed between the laminate substrate and the plurality of dies and adjacent to the conductive spacer.

According to another embodiment, a system for high-density chip-to-chip interconnection, the system comprising: a plurality of circuit dies; a laminate substrate adjacent to the plurality of circuit dies; a spacer disposed between the laminate substrate and one of the plurality of circuit dies; a conductive interposer disposed between the laminate substrate and the plurality of dies and adjacent to the conductive spacer; and a top layer of a printed circuit board (PCB) coupled with a bottom layer of the laminate substrate.

DETAILED DESCRIPTION

Figure 1:
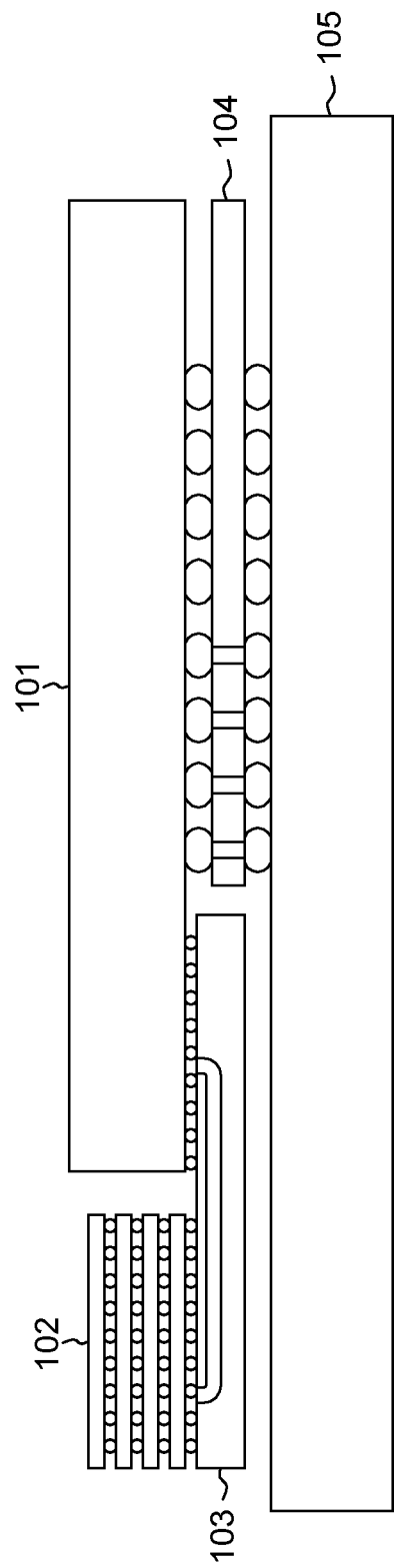
FIG. 1 is a side view of a diagram illustrating a silicon bridge without a through-silicon-via (TSV) in accordance with one embodiment of the present invention.

Embodiments of the present invention recognize that improvements to address the space limitation on interconnect regions (high-density chips) by utilizing small dimension silicon interposers (e.g., silicon bridge) along with the use of laminate spacer to interconnect regions of dies requiring high-density wiring. The silicon interposers provide a robust and cost effective design (e.g., 2.5D packaging). Furthermore, embodiments of the present invention can be used for either high bandwidth memory (HBM) or non-HBM applications. It is noted that the term, "silicon bridge", is used to denote a dimensional smaller interposer. Furthermore, a silicon bridge may contain TSVs depending on the packaging application.

Embodiments of the present invention will now be described in detail with reference to the accompanying figures. It is to be understood that the disclosed embodiments are merely illustrative of potential embodiments of the present invention and may take various forms. In addition, each of the examples given in connection with the various embodiments is intended to be illustrative, and not restrictive. Further, the figures are not necessarily to scale, and elements and features can have different dimensions than those depicted in the figures. Therefore, specific structural and functional details disclosed herein are not to be interpreted as limiting, but merely as a representative basis for teaching one skilled in the art to variously employ the present invention.

References in the specification to "an exemplary embodiment," and "other embodiments," etc., indicate that the embodiment described may include a particular feature, structure or characteristic, but every embodiment may not necessarily include the particular feature, structure or characteristic. Further, when a particular feature, structure, or characteristic is described in connection with an embodiment, it is submitted that it is within the knowledge of one skilled in the art to affect such feature, structure, or characteristic in connection with other embodiments whether or not specifically described.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

The term "dice" and "dies", along with its derivatives, may be used to describe one or more die.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

System-on-chip (SoC) is an integrated circuit that allows multiple dies to exist a on the same substrate. For example, a digital logic die, analog die and radio frequency die can be packaged on a single substrate. A package is the final stage of integrated circuit packaging wherein a block of semiconductor material is encapsulated in a supporting case that prevents physical damage and corrosion. The case is known as a "package" and supports the electrical contact which connect the device to a circuit board. This packaging has the advantage of having low power-consumption. However, the low power-consumption has been typically attributed to the digital devices on the substrate and provides an advantage for SoC design.

System-in-Packages (SiP) is similar to SoC and it is currently in use in order to meet the demands of system integration. SiP has various number of integrated circuits enclosed in a single module or package. Furthermore, the dies that make up the integrated circuits may be stacked vertically on the substrate and then they are internally connected to wires that are bonded to the package. SiP dies can be stacked vertically or tiled horizontally, unlike slightly less dense multi-chip modules, which place dies horizontally on a carrier. SiP connects the dies with standard off-chip wire bonds or solder bumps, unlike slightly denser three-dimensional integrated circuits which connect stacked silicon dies with conductors running through the die.

2.5D is a packaging methodology for including multiple die inside the same package arranged on a horizontal plane. 3D is another packaging methodology that stacks multiple dies on top of one another on a vertical plane in order to conserve space. 3D can use TSVs to connect the multiple dies together. One of the main advantages of 2D is that the die does not have to utilize the same process technology, which is a big problem with analog IP at advanced process geometries. In addition, unlike full 3D IC (e.g., 3D wafer-level packaging, etc.), which bonds wafers together; the thermal and electrical properties of 2.5D are easier to manage and control. The communication (e.g., electrical connection, etc.) between chips can be accomplished using interposer technology or silicon bridges.

The concept of 2.5D has been around for at least a decade. This concept began with multi-chip modules wherein multiple dies are packaged in a single package. SiP uses a similar strategy as 2.5D, and 2.5D sometimes is referred to as SiP. Although, the interconnect between die has evolved significantly since the SiP concept was first introduced, both methodology are still relevant in the current packaging field. Additionally, there are other types of packaging that are variants of existing technology, such as Package-in-Package (PiP) and Package-on-Package (PoP). As the name implies, PiP utilizes a smaller number of SiPs where it is mounted on a larger SiP. PiP utilizes SiP that is mounted on top of another PiP. These different type of package variants (e.g., SoC, PiP, PoP, etc.) may directly derive benefit from the disclosure of the present invention.

One of the big advantages of the approach of 2.5D packaging is that the die does not have to utilize the same process technology, which is a big problem with analog IC. Moreover, unlike full 3D-IC, which bonds wafers together, the thermal and electrical properties of 2.5D are easier to manage. Communication between chips is accomplished using interposer technology, silicon photonics, or silicon bridges.

Embodiments of the present invention recognize that improvements to address the space limitation on interconnect regions in packaging technology (e.g., 2.5D, 3D, etc.) by utilizing small dimension silicon interposers (e.g., silicon bridge) along with the use of spacers (e.g., laminate, copper standoffs, etc.) to interconnect regions of dies requiring high-density wiring.

FIG. 1 is a side view of a diagram illustrating a silicon bridge without through silicon via (TSV), also known as "the IC package assembly", in accordance with one embodiment of the present invention. The present embodiment can be used on multiple type of chip layouts. The present embodiment use laminate spacers in conjunction with a silicon bridge as part of the interconnect to a region of dice. Laminates of various grades (e.g., FR-4, etc.) can be made from composite materials such as woven fiberglass cloth with epoxy resin binder or polyimide.

As illustrated in FIG. 1, the IC package assembly comprises first die (e.g., CPU, GPU, etc) 101, second die 102, silicon bridge 103, high-density-via (HDV) core spacer 104 and laminate 105. It is noted that silicon bridge 103 is not embedded in laminate, but instead is a loose component that is assembled with the other components.

First die 101 and second die 102 of the present invention are well known in the technology field and are mentioned for illustrative purposes.

Silicon bridge 103 of the present invention are well known in the packaging field (e.g., 2.5D, etc). It is noted that silicon bridge 103 can contain TSVs, depending on the application. HDV core spacers 104 of the present invention are also well known in the packaging field (e.g., 2.5D, etc). However, it is the use of silicon bridge 103 in conjunction with HDV core spacers 104 in a unique configuration that provides an improvement in addressing the space limitation on interconnect regions on dies. This unique configuration is explained further below.

The top side of silicon bridge 103 along HDV core spacer 104 with is coupled with bottom side of first die 101 and second die 102. In another embodiment, ultra-thin core (UTC) laminate spacers can be used instead of HDV core spacer 104. In yet a further embodiment, silicon bridge 103 can be made from high density interconnect (HDI) material.

Figure 2:
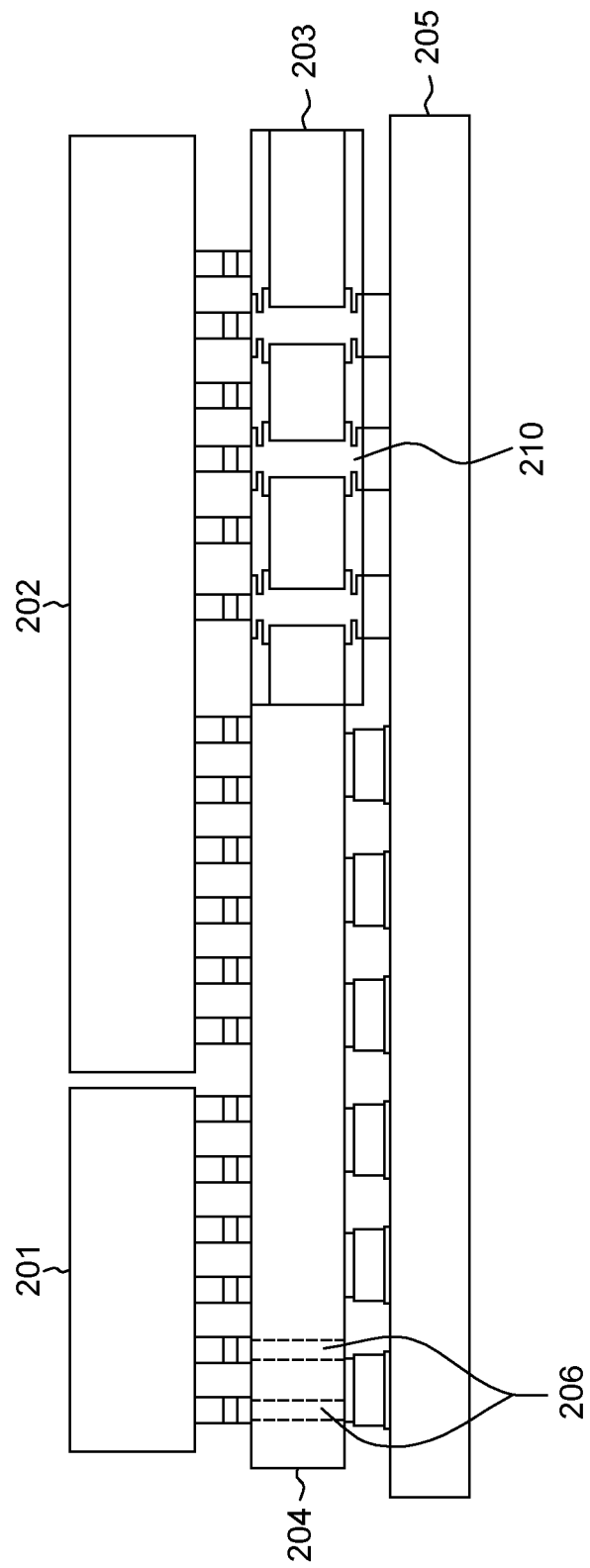
FIG. 2 is a side view of a diagram illustrating a silicon interposer with TSV in accordance with one embodiment of the present invention.

FIG. 2 is a side view of a diagram illustrating a silicon interposer with TSV also known as "the IC package assembly", in accordance with one embodiment of the present invention. As illustrated in FIG. 2, the IC package assembly comprises of first die 201, second die 202, organic spacer 203, silicon interposer 204, laminate 205, TSV 206 and vertical electrical connection 210. It is noted that silicon interposer 204 is not embedded in laminate, but instead is a loose component that is assembled with the other components. One of the main benefits in this embodiment (represented by FIG. 2) is that it allows for better power distribution and can be applicable to multiple type of chips including HBM.

First die 201 and second die 202 of the present invention are well known in the technology field and are mentioned for illustrative purposes. First die 201 and second die 202 comprises, but is not limited to, a logic or memory (e.g., HBM).

Organic spacer 203 and silicon interposer 204 of the present invention are well known in the packaging field (e.g., 2.5D, etc.). However, it is the use of organic spacer 203 in conjunction with silicon interposer 204 in a unique configuration that provides an improvement in addressing the space limitation on interconnect regions on dies. This unique configuration is explained further below.

The top side of organic spacer 203 along with silicon interposer 204 is coupled with bottom side of first 201 and second die 202. Furthermore, vertical connection 210, embedded within organic spacer 203, connects second die 202 to laminate 205.

TSVs 206 of the present invention are also well known in the packaging field (e.g., 2.5D, etc.).

In an embodiment, TSVs 206 are embedded throughout silicon interposer 204 connecting first die 201 to laminate 205.

Figure 3:
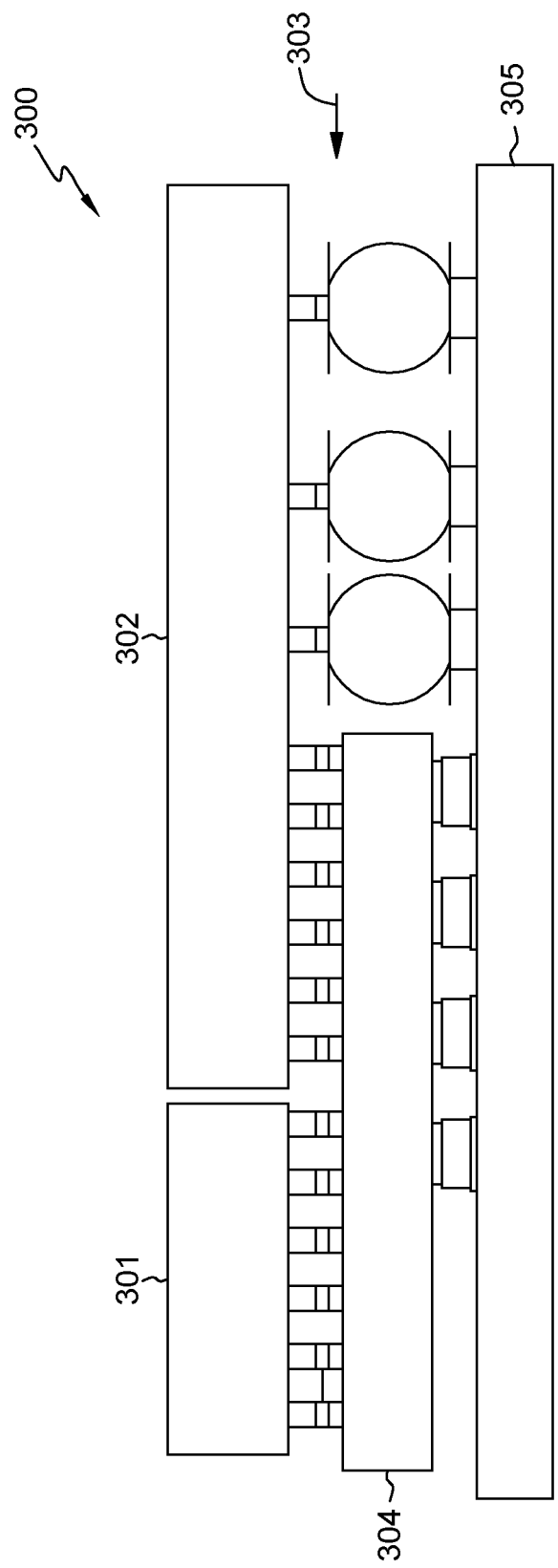
FIG. 3 is a side view diagram illustrating another silicon interposer with TSV, typically designated 300, in accordance with one embodiment of the present invention.

FIG. 3 is a diagram illustrating another silicon interposer with TSV also known as "the IC package assembly", in accordance with one embodiment of the present invention. As illustrated in FIG. 3, the IC package assembly contains first die 301, second die 302, copper spacer 303, silicon interposers-with-TSV 304, and laminate 305. The assembly and structures of silicon interposer of FIG. 3 is very similar to silicon interposer from FIG. 2. However, the major difference is that in this embodiment, copper ball spacers or "standoffs" are used instead of organic spacers.

First die 301 and second die 302 of the present invention are well known in the technology field and are mentioned for illustrative purposes. First die 301 and second die 302 comprises, but is not limited to, a logic or memory (e.g., HBM).

One of the reasons to use copper ball standoffs is due to the financial cost. It is very cost effective to use copper ball standoffs to achieve similar results of organic spacers. The size of the copper balls are typically 100 μm diameter and would be a fit for 132 μm to 150 μm C4 pitch.

Silicon interposers-with-TSV 304 of the present invention are well known in the packaging field (e.g., 2.5D, etc.). However, it is the use of silicon interposers-with-TSV 304 in conjunction with copper spacer 303 in a unique configuration that provides an improvement in addressing the space limitation on interconnect regions on dies. This unique configuration is explained further below.

The top side of copper spacer 303 along with silicon interposers-with-TSV 304 is coupled with bottom side of first die 301 and second die 302. In another embodiment, ultra-thin core (UTC) laminate spacers can be used instead of copper space 303.

Figure 4A:
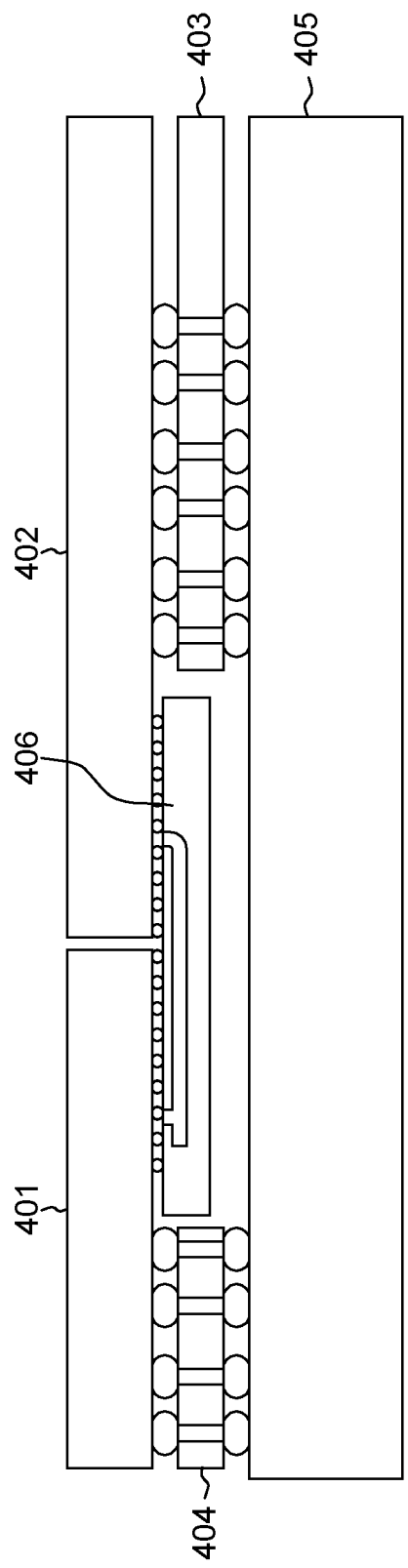
FIG. 4A is a side view diagram illustrating another silicon interposer fixture with TSV in accordance with one embodiment of the present invention.

FIG. 4A is a side view diagram illustrating another silicon interposer fixture with TSV in accordance with one embodiment of the present invention.

Figure 4B:
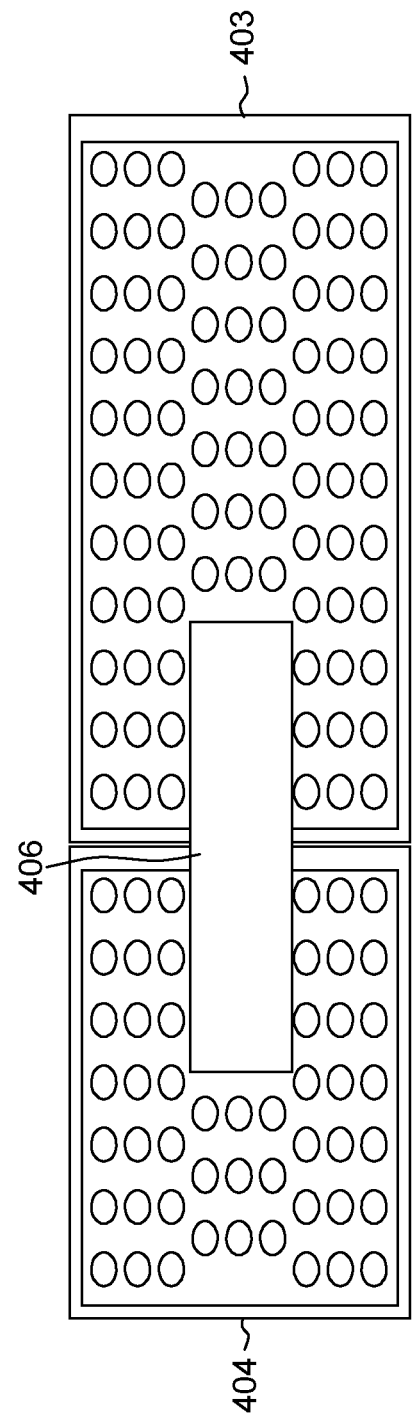
FIG. 4B is a bottom view diagram illustrating another silicon interposer fixture with TSV in accordance with one embodiment of the present invention.

FIG. 4B is a bottom view diagram illustrating another silicon interposer fixture with TSV in accordance with one embodiment of the present invention.

As illustrated in FIG. 4A and FIG. 4B, the IC package assembly comprises of first die (e.g., CPU, GPU, etc) 401, die 402, first high-density-via (HDV) core spacer 403, second HDV core spacer 404, laminate 405 and suspension silicon bridge 406. It is noted that first HDV core spacer 403, second HDV core spacer 404 and suspension silicon bridge 406 are not embedded in laminate 405, but instead are loose components that are assembled with the other components.

First die 401 and second die 402 of the present invention are well known in the technology field and are mentioned for illustrative purposes.

First HDV core spacer 403, second HDV core spacer 404 and suspension silicon bridge 406 of the present invention are well known in the packaging field (e.g., 2.5D, etc.). First HDV core spacer 403 and second HDV core spacer 404 of the present invention are also well known in the packaging field (e.g., 2.5D, etc.). However, it is the use of first HDV core spacer 403 and second HDV core spacer 404 in conjunction with suspension silicon bridge 406, in a unique configuration, that provides an improvement in addressing the space limitation on interconnect regions on dies. This unique configuration is explained further below.

The top side of suspension silicon bridge 406 along first HDV core spacer 403 and second HDV core spacer 404 with are coupled with bottom side of first die 401 and second die 402. Furthermore, suspension silicon bridge 406 is situated between first HDV core spacer 403 and second HDV core spacer 404. It is noted that suspension silicon bridge 406 attaches first die 401 to second die 402. Additionally, HDV core spacer 403 connects die 402 to the laminate 405 and HDV core spacer 404 connects die 401 to the laminate 405. In another embodiment, ultra thin core (UTC) laminate spacers can be used instead of either first HDV core spacer 403 or second HDV core spacer 404.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A package structure for high-density chip-to-chip interconnection, the package structure comprising:
    a plurality of circuit dies;
    an upper construct comprising a high bandwidth memory stack and the plurality of circuit dies adjacent to the high bandwidth memory stack in a horizontal alignment;
    a lower construct comprising a non-conductive laminate package substrate layer;
    one or more non-conductive spacers located between the upper construct and the lower construct, wherein the one or more non-conductive spacers contain an upper spacer construct and a lower spacer construct;
    one or more conductive interposers comprising a silicon bridge, wherein the silicon bridge is position between the upper and the lower constructs in parallel with the laminate package substrate layer;
    wherein an upper surface of the silicon bridge is electrically and directly coupled, but not embedded, to a first die surface of a predetermined region of the plurality of dies, wherein the first die surface is a bottom side of the plurality of dies and to a second surface of a predetermined region of the high bandwidth memory stack, wherein the second surface is a bottom surface of the high bandwidth memory stack and a lower surface of the silicon bridge adjacent and segregated from the laminate substrate layer and
    wherein the upper surface of the silicon bridge is parallel and adjacent to the upper spacer construct and the lower surface of the silicon bridge is parallel to the lower spacer construct; and
    wherein the upper spacer construct is directly coupled to the second surface of a predetermined region of the high bandwidth memory stack, the lower spacer construct is directly coupled to the laminate substrate layer.

2. The package structure of claim 1, wherein the one or more non-conductive spacers comprises a laminate material including a HDV (high-density-via) core with a vertical electrical connection.

3. The package structure of claim 2, wherein the plurality of circuit dies comprises an element selected from a group consisting of logic or memory dies.

4. The package structure of claim 1, wherein the one or more non-conductive spacers comprises of a copper material.

5. The package structure of claim 1, wherein the plurality of circuit dies comprises a logic and a memory.

6. The package structure of claim 1, wherein the laminate material comprises an ultra thin core (UTC).

7. A system for high-density chip-to-chip interconnection, the system comprising:
    a plurality of circuit dies;

an upper construct comprising a high bandwidth memory stack and the plurality of circuit dies adjacent to the high bandwidth memory stack in a horizontal alignment; a lower construct comprising a non-conductive laminate package substrate layer;

one or more non-conductive spacers located between the upper and the lower constructs, wherein the one or more non-conductive spacers contain an upper spacer construct and a lower spacer construct;

one or more conductive interposer comprising a silicon bridge position between the upper and the lower constructs in parallel with the laminate package substrate layer, wherein an upper surface of the silicon bridge is electrically and directly coupled, but not embedded, to a first die surface of a predetermined region of the plurality of dies, wherein the first die surface is a bottom side of the plurality of dies and to a second predetermined region of the high bandwidth memory stack, wherein the second surface is a bottom surface of the high bandwidth memory stack and a lower surface of the silicon bridge adjacent and segregated from the laminate substrate layer;

wherein the upper spacer construct is directly coupled to the second surface of a predetermined region of the high bandwidth memory stack, the lower spacer construct is directly coupled to the laminate substrate layer and wherein the one or more conductive interposers comprises a conductive organic material and TSV (through-silicon-via); and a top layer of a printed circuit board (PCB) coupled but not embedded with a bottom layer of the laminate package substrate layer.

8. The system of claim 7, wherein the one or more spacers comprises a conductive laminate material including a HDV core with a vertical electrical connection.

9. The system of claim 7, wherein the one or more spacers comprises a conductive laminate material.

10. The system of claim 9, wherein the plurality of circuit dies comprises an element selected from a group consisting of a central processing unit (CPU), a graphics processing unit (GPU) and application specific integrated circuit (ASIC).

11. The system of claim 9, wherein the one or more spacers comprises a conductive organic material.

12. The system of claim 11, wherein the conductive organic material comprises a vertical electrical connection.

13. The system of claim 9, wherein the one or more spacers comprises a copper material.

14. The system of claim 9, wherein the laminate material comprises an ultra thin core (UTC).

15. The system of claim 7, wherein the plurality of circuit dies comprises a high memory bandwidth memory (HBM).

* * * * *